United States Patent
Shih et al.

(10) Patent No.: US 9,449,935 B1
(45) Date of Patent: Sep. 20, 2016

(54) WAFER LEVEL PACKAGE AND FABRICATION METHOD THEREOF

(71) Applicant: INOTERA MEMORIES, INC., Taoyuan (TW)

(72) Inventors: Shing-Yih Shih, New Taipei (TW); Tieh-Chiang Wu, Taoyuan (TW)

(73) Assignee: INOTERA MEMORIES, INC., Taoyuan (TW)

( * ) Notice: Subject to any disclaimer, the term of this patent is extended or adjusted under 35 U.S.C. 154(b) by 0 days.

(21) Appl. No.: 14/810,415

(22) Filed: Jul. 27, 2015

(51) Int. Cl.
| | |
|---|---|
| *H01L 23/544* | (2006.01) |
| *H01L 23/00* | (2006.01) |
| *H01L 23/31* | (2006.01) |
| *H01L 23/528* | (2006.01) |
| *H01L 23/532* | (2006.01) |
| *H01L 23/522* | (2006.01) |

(52) U.S. Cl.
CPC ........... *H01L 24/17* (2013.01); *H01L 23/3157* (2013.01); *H01L 23/528* (2013.01); *H01L 23/5226* (2013.01); *H01L 23/53295* (2013.01); *H01L 2224/13023* (2013.01); *H01L 2224/13147* (2013.01); *H01L 2224/16113* (2013.01); *H01L 2224/16235* (2013.01); *H01L 2924/04642* (2013.01); *H01L 2924/05042* (2013.01); *H01L 2924/05442* (2013.01); *H01L 2924/06* (2013.01); *H01L 2924/07025* (2013.01); *H01L 2924/3511* (2013.01); *H01L 2924/381* (2013.01)

(58) Field of Classification Search
CPC ..... H01L 23/295; H01L 23/26; H01L 21/56; H01L 24/02; H01L 24/14; H01L 23/563; H01L 25/067; H01L 23/481; H01L 23/3107

USPC ....... 257/737, 738, 734, 777, 685, 668, 691, 257/692, 693, 696, 698, 784, 786
See application file for complete search history.

(56) References Cited

U.S. PATENT DOCUMENTS

| | | | |
|---|---|---|---|
| 8,980,689 B2 | 3/2015 | Kwak | |
| 2009/0140442 A1* | 6/2009 | Lin | H01L 21/565 257/778 |
| 2011/0186960 A1* | 8/2011 | Wu | H01L 21/486 257/508 |
| 2011/0254156 A1* | 10/2011 | Lin | H01L 21/566 257/737 |
| 2012/0168938 A1* | 7/2012 | Gan | H01L 24/19 257/737 |
| 2014/0070406 A1 | 3/2014 | Mohammed | |
| 2014/0152509 A1* | 6/2014 | Liu | H01Q 9/0407 343/700 MS |
| 2015/0014855 A1* | 1/2015 | Yap | H01L 23/48 257/773 |
| 2015/0194362 A1* | 7/2015 | Otremba | H01L 23/367 257/676 |

(Continued)

FOREIGN PATENT DOCUMENTS

EP 1 229 577 A2 8/2002

*Primary Examiner* — Alexander Oscar Williams
(74) *Attorney, Agent, or Firm* — Winston Hsu; Scott Margo

(57) ABSTRACT

A semiconductor device includes a chip having an active surface and a rear surface that is opposite to the active surface; a molding compound covering and encapsulating the chip except for the active surface; and a redistribution layer (RDL) on the active surface and on the molding compound. The RDL is electrically connected to the chip. The RDL includes an organic dielectric layer and an inorganic dielectric hard mask layer on the organic dielectric layer. The RDL further includes metal features in the organic dielectric layer and the inorganic dielectric hard mask layer.

9 Claims, 10 Drawing Sheets

(56) References Cited

U.S. PATENT DOCUMENTS

| | | | |
|---|---|---|---|
| 2015/0243575 A1* | 8/2015 | Strothmann | H01L 23/3114 257/773 |
| 2015/0243636 A1* | 8/2015 | Hu | H01L 24/19 257/741 |
| 2015/0318262 A1* | 11/2015 | Gu | H01L 25/0655 257/738 |
| 2015/0380334 A1* | 12/2015 | Hu | H01L 23/36 257/712 |
| 2016/0049385 A1* | 2/2016 | Yu | H01L 23/481 257/774 |

* cited by examiner

WAFER LEVEL PACKAGE AND FABRICATION METHOD THEREOF

BACKGROUND OF THE INVENTION

1. Field of the Invention

The present invention relates generally to the field of semiconductor packaging, and more particularly to a wafer level package (WLP) having fine-pitch redistribution layer (RDL) and a method for manufacturing the same.

2. Description of the Prior Art

As known in the art, fan-out wafer-level packaging is a packaging process in which contacts of a semiconductor die are redistributed over a larger area through a redistribution layer (RDL).

The RDL is typically defined by the addition of metal and dielectric layers onto the surface of the wafer to re-route the I/O layout into a looser pitch footprint. Such redistribution requires thin film polymers such as BCB, PI or other organic polymers and metallization such as Al or Cu to reroute the peripheral pads to an area array configuration.

In wafer level packaging, the wafer and the dies mounted on the wafer are typically covered with a relatively thick layer of the molding compound. The thick layer of the molding compound results in increased warping of the packaging due to coefficient of thermal expansion (CTE) mismatch, and the thickness of the packaging. It is known that wafer warpage continues to be a concern.

Warpage can prevent successful assembly of a die-to-wafer stack because of the inability to maintain the coupling of the die and wafer. Warpage issue is serious especially in a large sized wafer, and has raised an obstacle to a wafer level semiconductor packaging process that requires fine-pitch RDL process. Therefore, there remains a need in the art for an improved method of manufacturing wafer level packages.

SUMMARY OF THE INVENTION

The present invention is directed to provide an improved semiconductor device and fabrication method that is capable of implementing fine-pitch redistribution layer.

In one aspect of the invention, a semiconductor device includes a chip having an active surface and a rear surface that is opposite to the active surface; a molding compound covering and encapsulating the chip except for the active surface; and a redistribution layer (RDL) on the active surface and on the molding compound, wherein the RDL is electrically connected to the chip, wherein the RDL comprises at least an organic dielectric layer and an inorganic dielectric hard mask layer on the organic dielectric layer, and wherein the RDL further comprises metal features in the organic dielectric layer and the inorganic dielectric hard mask layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

Figure 1:
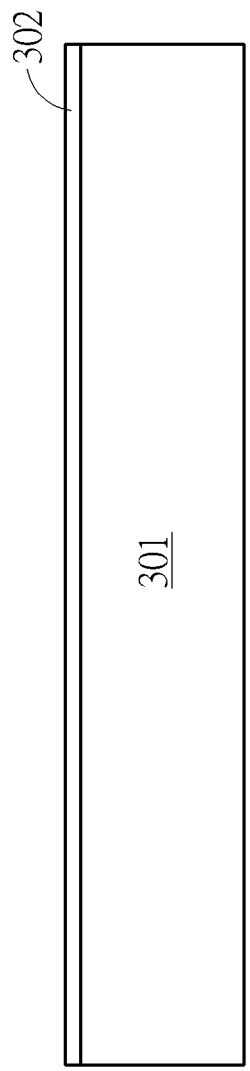
FIG. 1 to FIG. 10 are schematic, cross-sectional diagrams showing an exemplary method for fabricating a wafer level package having fine-pitch redistribution layer (RDL) according to one embodiment of the invention.

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present invention.

The following detailed description is, therefore, not to be taken in a limiting sense, and the scope of the present invention is defined only by the appended claims, along with the full scope of equivalents to which such claims are entitled.

One or more implementations of the present invention will now be described with reference to the attached drawings, wherein like reference numerals are used to refer to like elements throughout, and wherein the illustrated structures are not necessarily drawn to scale.

The terms "die", "semiconductor chip", and "semiconductor die" are used interchangeable throughout the specification. The terms wafer and substrate used herein include any structure having an exposed surface onto which a layer is deposited according to the present invention, for example, to form the circuit structure such as a redistribution layer (RDL). The term substrate is understood to include semiconductor wafers, but not limited thereto. The term substrate is also used to refer to semiconductor structures during processing, and may include other layers that have been fabricated thereupon.

Please refer to FIG. 1 to FIG. 10. FIG. 1 to FIG. 10 are schematic, cross-sectional diagrams showing an exemplary method for fabricating a wafer level package having fine-pitch redistribution layer (RDL) according to one embodiment of the invention.

As shown in FIG. 1, a carrier 301 is prepared. The carrier 301 may comprise a releasable substrate material. An adhesive layer 302 is disposed on a top surface of the carrier 301. In one embodiment, the carrier 301 may be a glass substrate, but may alternatively be a wafer, semiconductor, metal, synthetic or other material having a suitable topography and structural rigidity. In one embodiment, the adhesive layer 302 may be adhesive tape, or alternatively, may be a glue or epoxy applied to the carrier 301 via a spin-on process, or the like.

Figure 2:
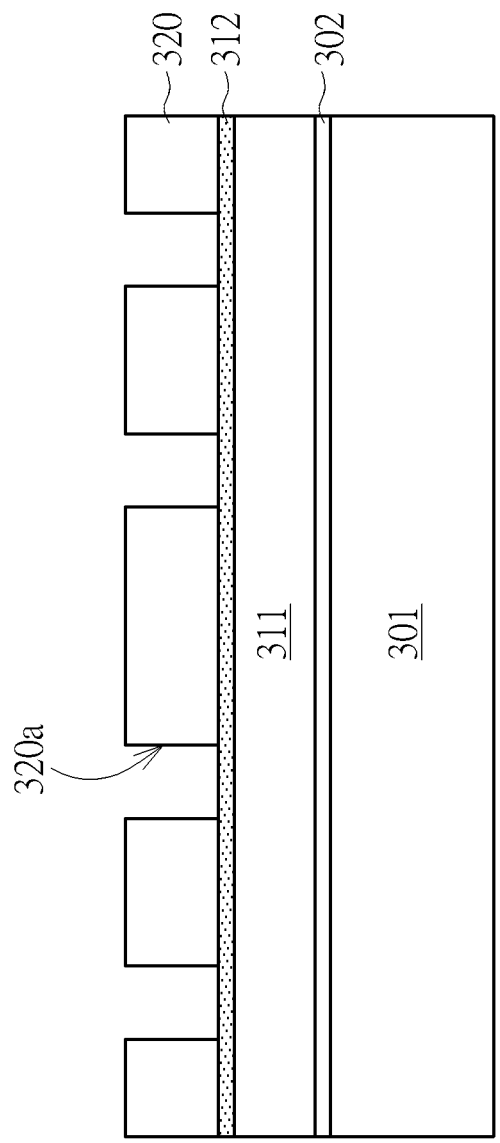

As shown in FIG. 2, subsequently, at least an organic dielectric layer 311 is formed on the adhesive layer 302. According to the illustrated embodiment, the organic dielectric layer 311 may comprise polyimide (PI), benzocyclobutene (BCB), polybenzoxazole (PBO), or other organic insulating material. An inorganic dielectric hard mask layer 312 is then deposited on the organic dielectric layer 311. According to the illustrated embodiment, the inorganic dielectric hard mask layer 312 may comprise $SiO_2$, SixNy, SiON, SiC, PSG, BPSG, or other inorganic dielectric material, which has high etching selectivity with respect to the underlying organic dielectric layer 311.

A photoresist pattern 320 is then formed on the inorganic dielectric hard mask layer 312. The photoresist pattern 320 may be formed by using a conventional lithographic process including but not limited to photoresist coating, baking, exposure, development, and so on. The photoresist pattern 320 comprises openings 320a that expose predetermined regions of the top surface of the inorganic dielectric hard mask layer 312 to be etched.

Figure 3:
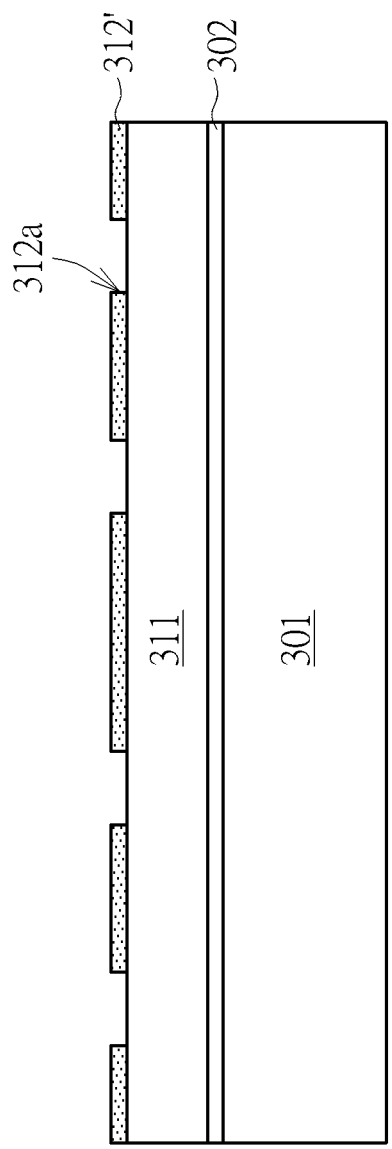

As shown in FIG. 3, a dry etching process is then performed to etch the exposed regions of the inorganic dielectric hard mask layer 312 through the openings 320a in the photoresist pattern 320, thereby transferring the circuit pattern in the photoresist pattern 320 into the inorganic dielectric hard mask layer 312. Subsequently, the remaining photoresist pattern 320 is removed. At this point, a patterned hard mask 312' is formed. The patterned hard mask 312' comprises openings 312a that predetermined regions of the top surface of the organic dielectric layer 311 to be etched.

Figure 4:
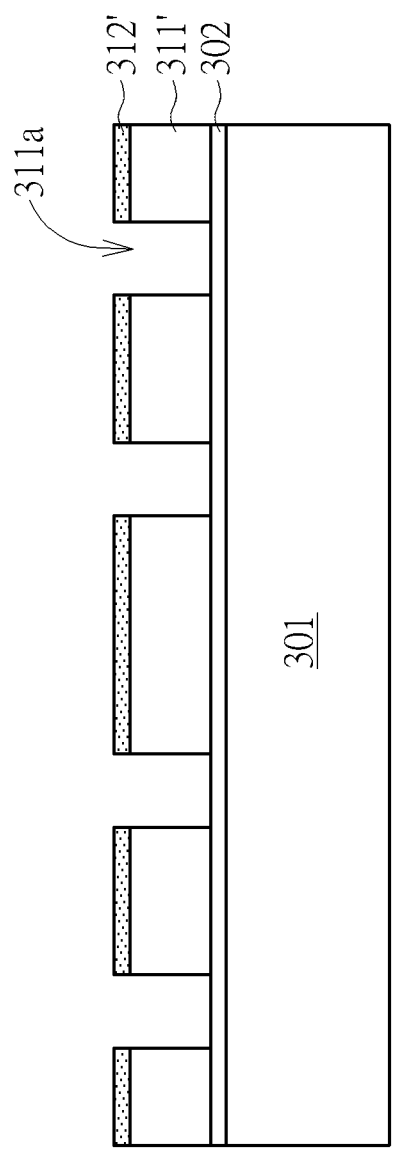

As shown in FIG. 4, using the patterned hard mask 312' as an etching hard mask, a dry etching process is performed to etch the predetermined regions of the organic dielectric layer 311 through the openings 312a, thereby transferring the circuit pattern in the patterned hard mask 312' into the organic dielectric layer 311. As indicated in FIG. 4, openings 311a are formed in the patterned organic dielectric layer 311'. These openings 311a expose a portion of the adhesive layer 302.

Figure 5:
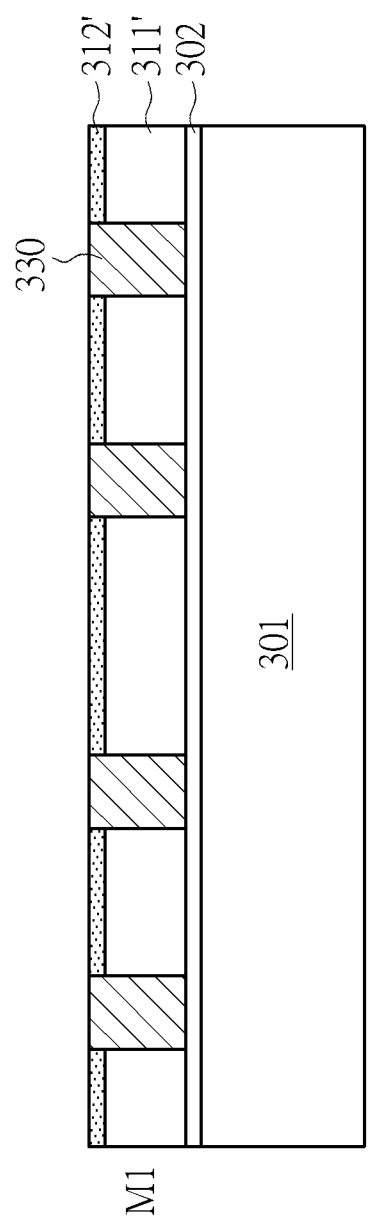

As shown in FIG. 5, metal features 330 are formed in the openings 311a. The metal features 330 may comprise fine-pitch vias or metal wires, but not limited thereto. For example, to form the metal features 330, a conductive material such as TiN, Ti, W, Cu, Al, or the like may be deposited into the openings 311a and onto the top surface of the patterned hard mask 312'. A polishing process such as a chemical mechanical polishing (CMP) may be performed to remove excess conductive material outside the openings 311a. During the CMP process, the patterned hard mask 312' may function as a polish stop layer. At this point, a first metal level (M1) of the RDL is completed.

Figure 6:
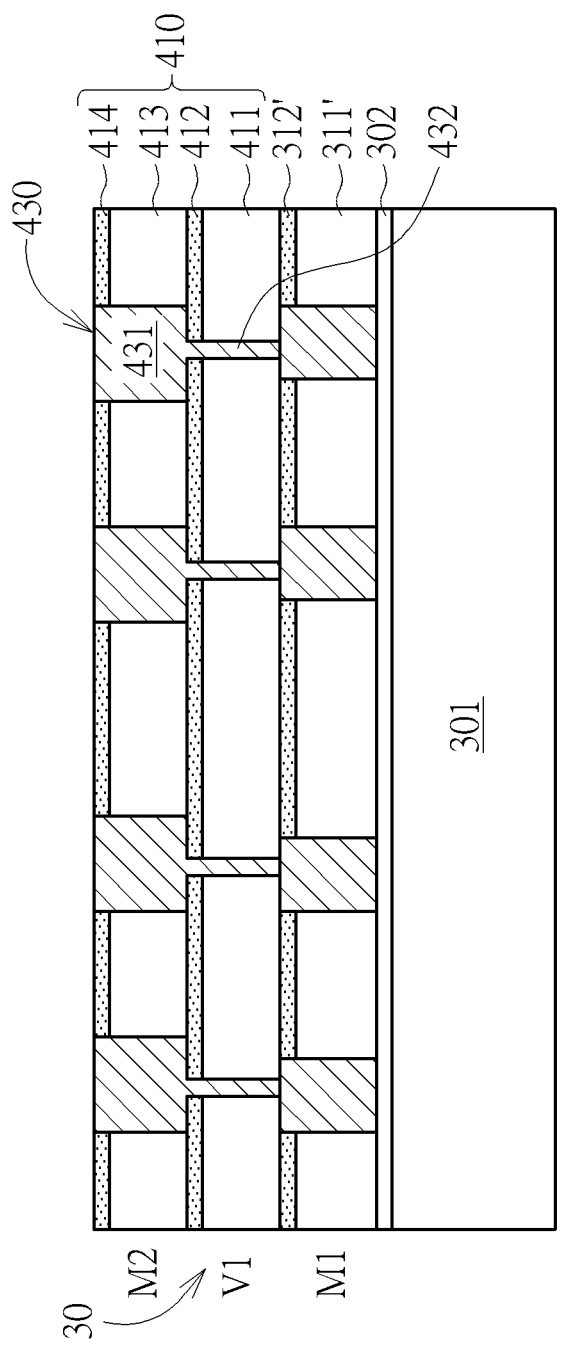

As shown in FIG. 6, optionally, a multilayer dielectric stack 410 including alternating material types (organic/inorganic) as described above may be formed on the first metal level (M1) of the RDL. For example, the multilayer dielectric stack 410 may comprise an organic dielectric layer 411 covering the metal features 330 and the patterned hard mask 312', an inorganic dielectric hard mask layer 412 directly on the organic dielectric layer 411, an organic dielectric layer 413 directly on the inorganic dielectric hard mask layer 412, and an inorganic dielectric hard mask layer 414 directly on the organic dielectric layer 413.

After the formation of the multilayer dielectric stack 410, the process steps shown in FIG. 2 to FIG. 5 may be repeated to form metal features 430 in the multilayer dielectric stack 410. For example, the metal features 430 may be formed by using a copper dual damascene process to form a metal wire feature 431 (second metal level or M2) in the organic dielectric layer 413 and the inorganic dielectric hard mask layer 414, and a metal via feature 432 (V1) in the organic dielectric layer 411 and the inorganic dielectric hard mask layer 412 for electrically connecting the metal wire feature 431 to the first metal level (M1) of the RDL 30. It is understood that more levels (e.g. M3, M4 . . . ) of the RDL 30 may be fabricated using the same method as described above.

Figure 7:
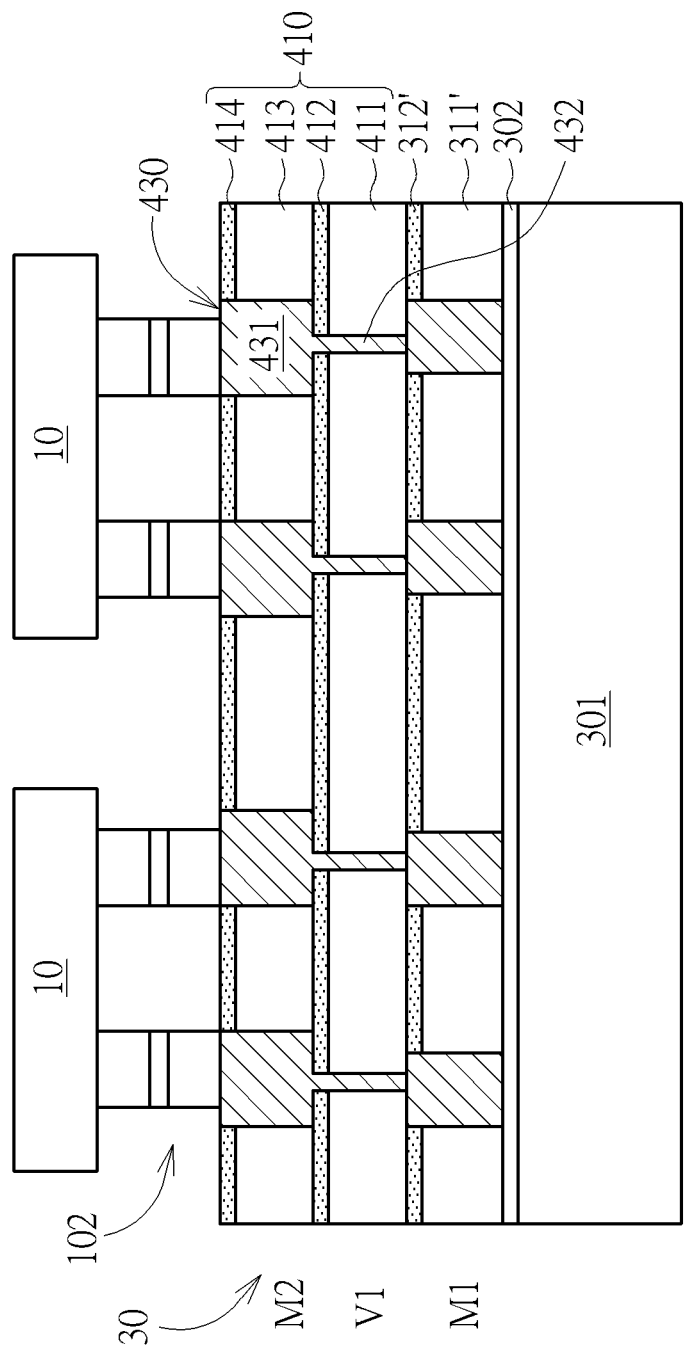

Subsequently, as shown in FIG. 7, semiconductor chips or dies 10 may be mounted on the RDL 30 to thereby forming a stacked chip-to-wafer (C2W) construction. For example, the semiconductor chips or dies 10 may be mounted on the RDL 30 by using a conventional surface mount technique, but not limited thereto. To provide electrical connection between the chips and the RDL 30, a plurality of bumps 102 such as micro-bumps or copper pillars are formed under the chips 10. Optionally, a thermal process may be performed to reflow the bumps 102.

Figure 8:
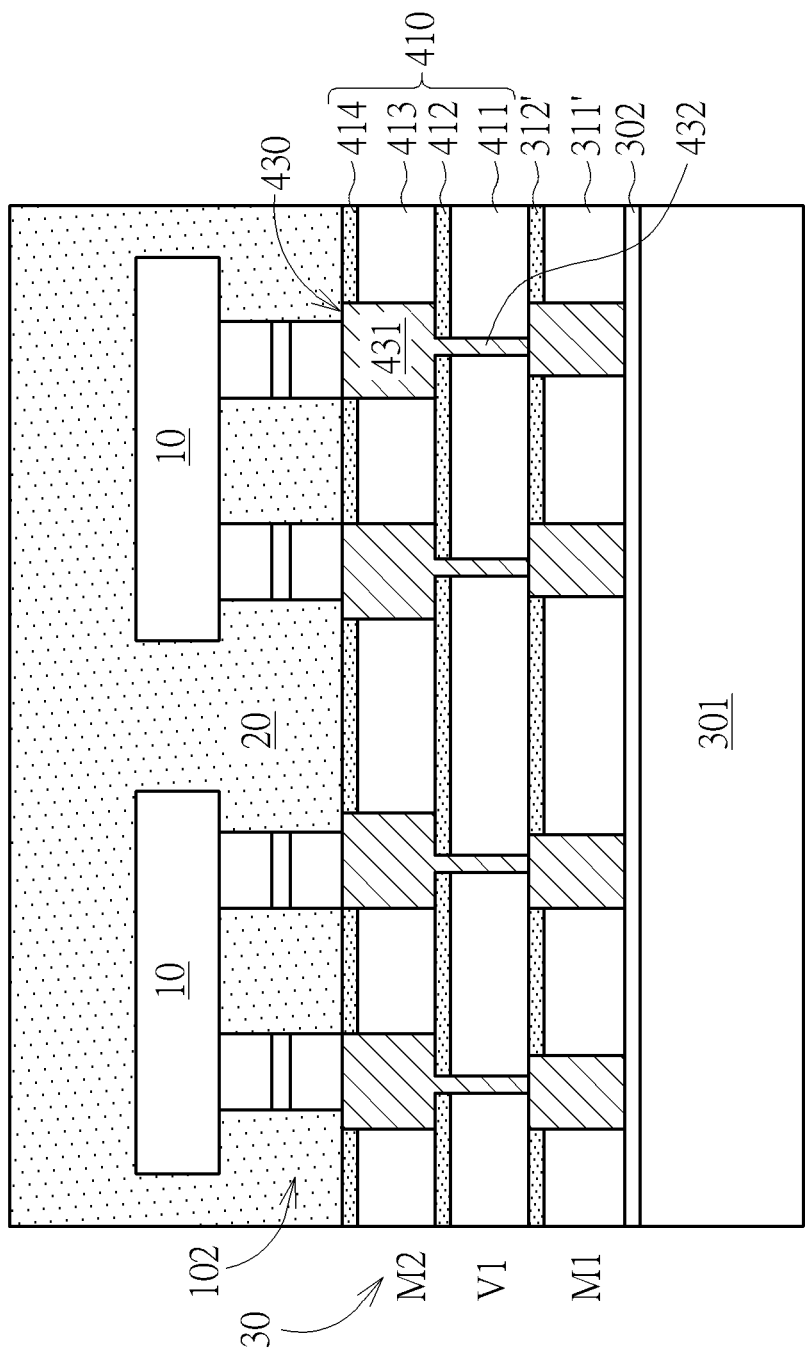

As shown in FIG. 8, after the die-bonding process, a molding compound 20 is applied. The molding compound 20 covers the attached chips 10 and the top surface of the RDL 30. The mold compound 20 may be subjected to a curing process.

According to the illustrated embodiment, the molding compound 20 may be formed using thermoset molding compounds in a transfer mold press, for example. Other means of dispensing the molding compound may be used. Epoxies, resins, and compounds that are liquid at elevated temperature or liquid at ambient temperatures may be used. The molding compound 20 is an electrical insulator, and may be a thermal conductor. Different fillers may be added to enhance the thermal conduction, stiffness or adhesion properties of the molding compound 20.

Figure 9:
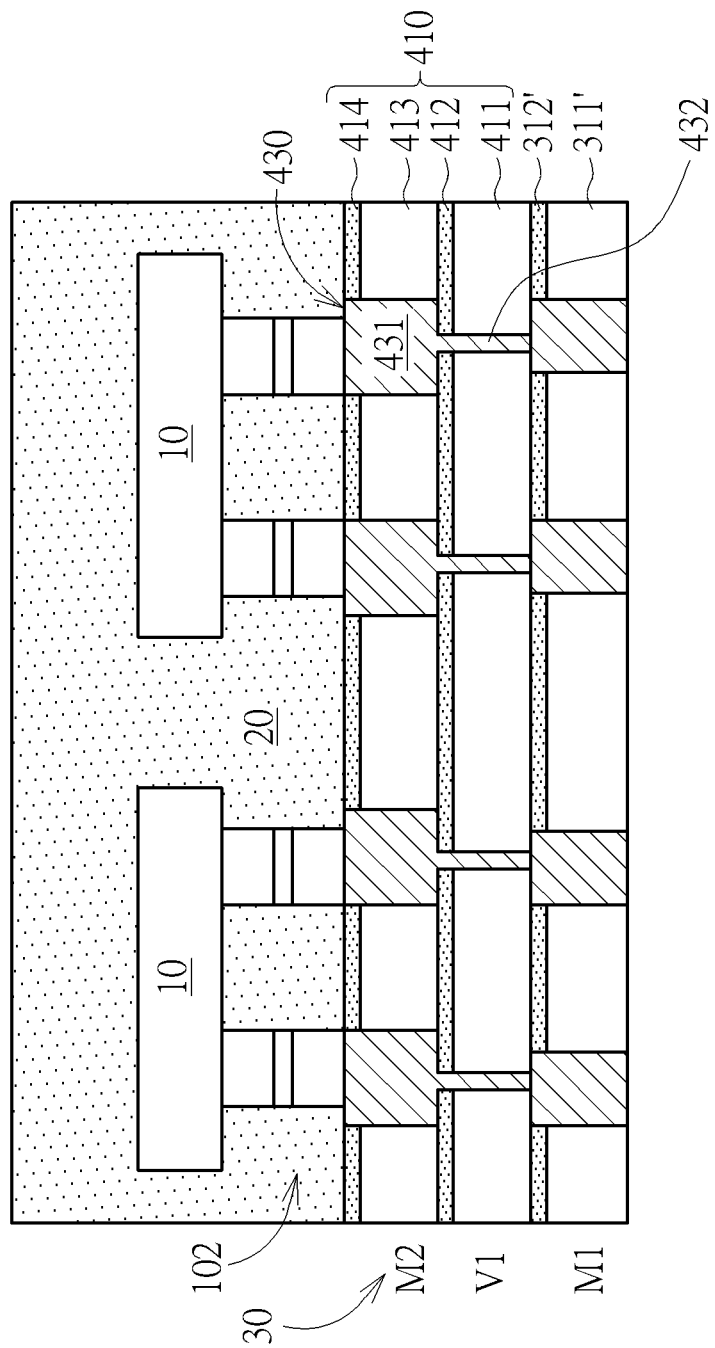

As shown in FIG. 9, after the formation of the molding compound 20, the carrier 301 and the adhesive layer 302 are removed or peeled off to expose a lower side of the RDL 30.

Figure 10:
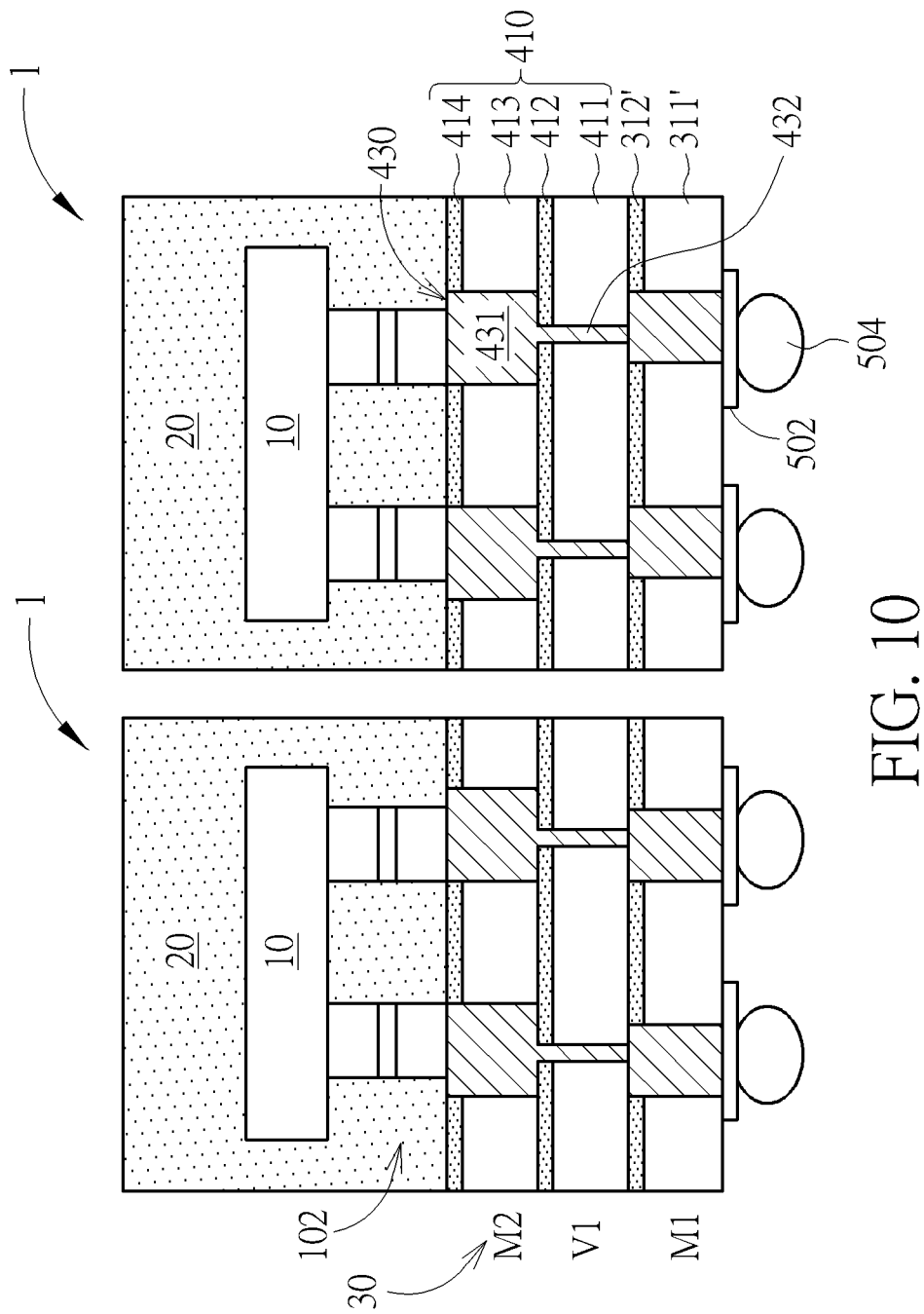

As shown in FIG. 10, a dicing or sawing process may be performed along the kerf region to separate individual wafer level packages 1 from one another. On the exposed lower side of the RDL 30, an insulating layer (not shown) and a metal layer 502 may be formed. Solder bumps or solder balls 504 may be formed on the metal layer 502 for further connection. It is understood that the sectional structures depicted in the figures are for illustration purposes only. Some dielectric layers or passivation layers may be omitted. For example, in some embodiments, a passivation layer may be disposed on the layer 414 and a passivation layer may be disposed under the layer 311'.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a chip having an active surface and a rear surface that is opposite to the active surface;
   a molding compound at least partially encapsulating the chip; and
   a redistribution layer (RDL) on the active surface and on the molding compound, wherein the RDL is electrically connected to the chip, wherein the RDL comprises at least an organic dielectric layer and an inorganic dielectric hard mask layer on the organic dielectric layer, and wherein the RDL further comprises metal features in the organic dielectric layer and the inorganic dielectric hard mask layer, wherein the inorganic dielectric hard mask layer acts as a pattern transferring hard mask when transferring a circuit pattern of the metal features into the organic dielectric layer.

2. The semiconductor device according to claim 1, wherein the metal features in the organic dielectric layer and the inorganic dielectric hard mask layer constitute a first metal level of the RDL.

3. The semiconductor device according to claim 2 further comprising a multilayer dielectric stack including alternating organic and inorganic material types laminated on the inorganic dielectric hard mask layer and on the metal features.

4. The semiconductor device according to claim 3, wherein a metal wire feature and a metal via feature are disposed in the multilayer dielectric stack.

5. The semiconductor device according to claim 4, wherein the metal wire feature constitute a second metal level of the RDL.

6. The semiconductor device according to claim 1, wherein the organic dielectric layer comprises polyimide (PI), benzocyclobutene (BCB), or polybenzoxazole (PBO).

7. The semiconductor device according to claim 1, wherein the inorganic dielectric hard mask layer comprises $SiO_2$, SixNy, SiON, SiC, PSG, or BPSG.

8. The semiconductor device according to claim 1, wherein the RDL is electrically connected to the chip through a plurality of bumps.

9. The semiconductor device according to claim 1, wherein the RDL is electrically connected to the chip through a plurality of copper pillars.

\* \* \* \* \*